(12) United States Patent
Kim et al.

(10) Patent No.: US 11,749,518 B2
(45) Date of Patent: Sep. 5, 2023

(54) PACKAGE COMPRISING AN ION-TRAP AND METHOD OF FABRICATION

(71) Applicant: Duke University, Durham, NC (US)

(72) Inventors: Jungsang Kim, Chapel Hill, NC (US); Kai Hudek, Durham, NC (US); Geert Vrijsen, Durham, NC (US); Robert Spivey, Durham, NC (US); Peter Maunz, Durham, NC (US)

(73) Assignee: Duke University, Durham, NC (US)

( * ) Notice: Subject to any disclaimer, the term of this patent is extended or adjusted under 35 U.S.C. 154(b) by 146 days.

(21) Appl. No.: 16/913,932

(22) Filed: Jun. 26, 2020

(65) Prior Publication Data

US 2020/0335320 A1 Oct. 22, 2020

Related U.S. Application Data

(62) Division of application No. 15/935,312, filed on Mar. 26, 2018, now Pat. No. 10,755,913.
(Continued)

(51) Int. Cl.
*H01J 49/42* (2006.01)
*G06N 10/00* (2022.01)
(Continued)

(52) U.S. Cl.
CPC ............ *H01J 49/422* (2013.01); *G06N 10/00* (2019.01); *H01J 49/16* (2013.01); *H01J 49/24* (2013.01); *H01J 49/42* (2013.01)

(58) Field of Classification Search
None
See application file for complete search history.

(56) References Cited

U.S. PATENT DOCUMENTS

| | | | |
|---|---|---|---|
| 4,039,828 A | 8/1977 | Pokar et al. | |
| 4,607,493 A | 8/1986 | Sukenobu | |

(Continued)

FOREIGN PATENT DOCUMENTS

| | | |
|---|---|---|
| CN | 1828818 A | 9/2006 |
| CN | 104040359 A | 9/2014 |

(Continued)

OTHER PUBLICATIONS

D T C Allcock et al., Reduction of heating rate in a microfabricated ion trap by pulsed-laser cleaning, Dec. 16, 2011, New Journal of Physics, vol. 13.

(Continued)

*Primary Examiner* — Andrew Smyth
(74) *Attorney, Agent, or Firm* — KAPLAN BREYER SCHWARZ, LLP

(57) ABSTRACT

A package-level, integrated high-vacuum ion-chip enclosure having improved thermal characteristics is disclosed. Enclosures in accordance with the present invention include first and second chambers that are located on opposite sides of a chip carrier, where the chambers are fluidically coupled via a conduit through the chip carrier. The ion trap is located in the first chamber and disposed on the chip carrier. A source for generating an atomic flux is located in the second chamber. The separation of the source and ion trap in different chambers affords thermal isolation between them, while the conduit between the chambers enables the ion trap to receive the atomic flux.

17 Claims, 10 Drawing Sheets

Related U.S. Application Data

(60) Provisional application No. 62/533,927, filed on Jul. 18, 2017.

(51) Int. Cl.
*H01J 49/16* (2006.01)
*H01J 49/24* (2006.01)

(56) References Cited

U.S. PATENT DOCUMENTS

| | | | |
|---|---|---|---|
| 6,169,004 | B1 | 1/2001 | Mizuno et al. |
| 6,660,340 | B1 | 12/2003 | Kirkpatrick |
| 6,777,673 | B2 | 8/2004 | Chang et al. |
| 7,411,187 | B2 | 8/2008 | Monroe et al. |
| 7,709,807 | B2 | 5/2010 | Mcclelland et al. |
| 7,859,350 | B1 | 12/2010 | Schwindt et al. |
| 8,558,202 | B2 | 10/2013 | Yanagida et al. |
| 8,829,425 | B1 * | 9/2014 | Yang .................. H01J 49/0022 250/281 |
| 8,835,833 | B2 | 9/2014 | Du et al. |
| 9,207,672 | B2 | 12/2015 | Williams et al. |
| 9,607,271 | B2 | 3/2017 | Papile |
| 9,791,370 | B2 | 10/2017 | Goeders et al. |
| 9,858,531 | B1 | 1/2018 | Monroe et al. |
| 10,755,913 | B2 | 8/2020 | Kim et al. |
| 2003/0122070 | A1 | 7/2003 | Chang et al. |
| 2006/0169882 | A1 | 8/2006 | Pau et al. |
| 2006/0289747 | A1 * | 12/2006 | Schultz ................ H01J 49/009 250/288 |
| 2007/0040113 | A1 | 2/2007 | Monroe et al. |
| 2008/0296483 | A1 | 12/2008 | Mcclelland et al. |
| 2009/0212204 | A1 | 8/2009 | McBride |
| 2009/0279667 | A1 | 11/2009 | Rogers et al. |
| 2010/0123075 | A1 * | 5/2010 | Dantus ................ H01J 49/4205 250/288 |
| 2012/0112056 | A1 * | 5/2012 | Brucker ................ H01J 49/429 250/288 |
| 2015/0034820 | A1 | 2/2015 | Evans-Nguyen et al. |
| 2016/0305882 | A1 | 10/2016 | Goeders et al. |
| 2016/0322188 | A1 * | 11/2016 | Youngner ................ H01J 9/14 |
| 2017/0330739 | A1 * | 11/2017 | Hosaka .................. H01J 49/20 |
| 2018/0233338 | A1 | 8/2018 | Hughes |
| 2019/0027355 | A1 | 1/2019 | Kim et al. |
| 2021/0335591 | A1 | 10/2021 | Kim et al. |

FOREIGN PATENT DOCUMENTS

| | | | | |
|---|---|---|---|---|
| CN | 105097412 | A | 11/2015 | |
| CN | 106683976 | | 5/2017 | |
| EP | 3176809 | A1 * | 6/2017 | ............. G01N 27/62 |
| EP | 3176809 | A1 | 6/2017 | |
| JP | 2016-031849 | A | 3/2016 | |
| WO | 2009/025893 | A2 | 2/2009 | |
| WO | 2015/031321 | A1 | 3/2015 | |
| WO | WO-2016017712 | A1 * | 2/2016 | ............. G01N 27/62 |

OTHER PUBLICATIONS

English Translation of Office Action issued in related Chinese Patent Application No. 201880054984.8 dated Mar. 3, 2021.
Rachel Noek et al., High Speed, High Fidelity Detection of an Atomic Hyperfine Qubit, Nov. 12, 2013, Optics Letters, vol. 38, No. 22.
Wei-Bang et al., A grooved planar ion trap design for scalable quantum information processing, Jul. 31, 2012, Acta Optica Sinica, 0727001.
Examiner Michael Sewtz, Extended European Search Report issued in related EP Patent Application No. 18835570.5 dated Mar. 9, 2021.
Office Action issued in Japanese patent application No. 2020-502428, dated May 16, 2022, 8 pp. w/ translation.
Office Action issued in corresponding Chinese patent application No. 201880054984.8, dated Jul. 23, 2021, 12 w/ translation.
Authorized Officer Shane Thomas, International Search Report and Written Opinion issued in International PCT Application No. PCT/US18/42717 dated Nov. 20, 2018.
D. Stick et al., "Ion trap in a semiconductor chip", doi: 10.1038/nphys171, "nature physics", dated Dec. 11, 2005, pp. 36-39, vol. 2, Publisher: Nature Publishing Group.
K. R. Brown et al., "Co-Designing a Scalable Quantum Computer with Trapped Atomic Ions", dated Feb. 10, 2016, pp. 1-11.
Non-Final Office Action received for U.S. Appl. No. 15/935,312, dated Oct. 16, 2019, 25 pages.
Notice of Allowance received for U.S. Appl. No. 15/935,312, dated Apr. 8, 2020, 11 pages.
Requirement for Restriction/Election received for U.S. Appl. No. 15/935,312, dated May 6, 2019, 8 pages.
Ronald P. Manginell et al., "In situ dissolution or deposition of Ytterbium (Yb) metal in microhotplate wells for a miniaturized atomic clock", "Optics Express", dated Oct. 12, 2012, vol. 20, No. 22, Publisher: Optical Society of America.
Authorized Officer Shane Thomas, International Search Report and Written Opinion dated Oct. 21, 2021 in PCT Patent Application No. PCT/US2021/041143.
P. Obšil, A room-temperature ion trapping apparatus with hydrogen partial pressure below 10-11 mBar, Dec. 2, 2019.
Yuhi Aikyo, Vacuum Characterization of a Compact Room-temperature Trapped Ion System, Jul. 15, 2020.
Non-Final Office Action issued in U.S. Appl. No. 16/913,932, dated Aug 30, 2022, 16 pp.

* cited by examiner

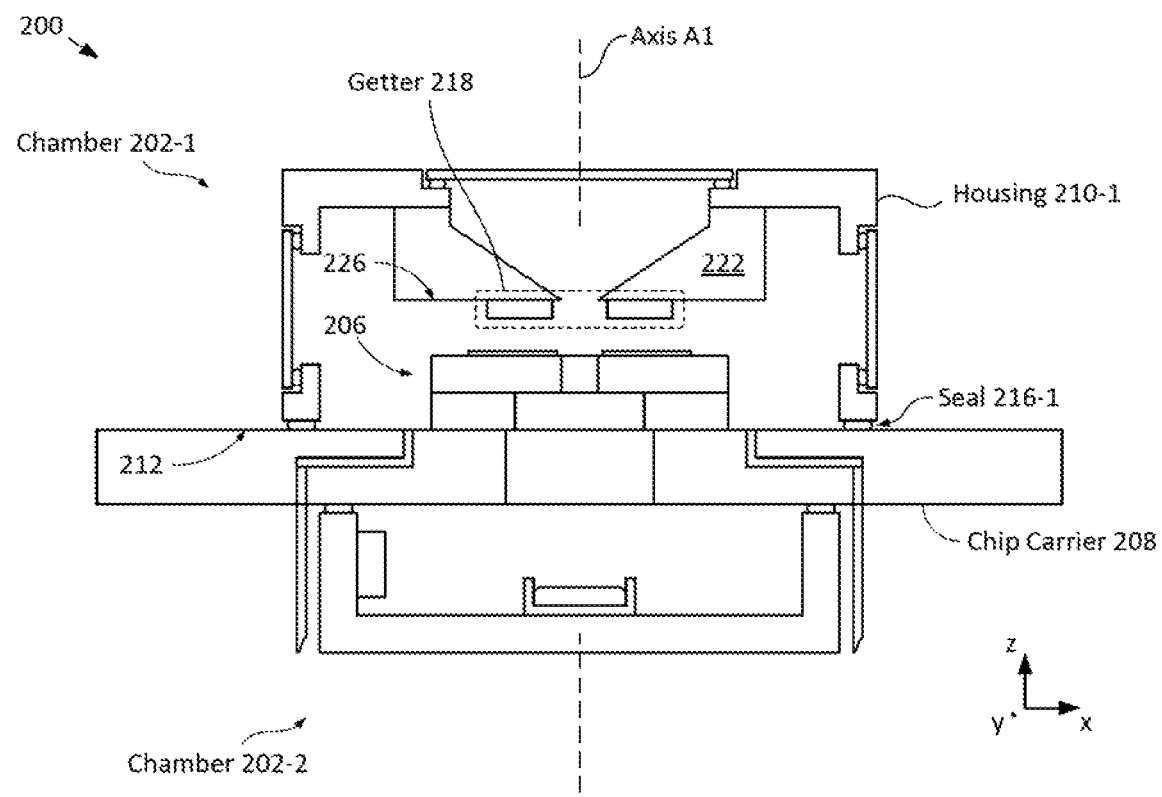

PACKAGE COMPRISING AN ION-TRAP AND METHOD OF FABRICATION

CROSS REFERENCE TO RELATED APPLICATIONS

This application is a divisional application of co-pending U.S. patent application Ser. No. 15/935,312, filed Mar. 26, 2018, which claims the benefit of U.S. Provisional Application Ser. No. 62/533,927, filed Jul. 18, 2017, entitled "Compact UHV Package for Trapped Ion Systems and Methods of Making and Using Same", each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

STATEMENT REGARDING FEDERALLY SPONSORED RESEARCH

This invention was made with Government support under Federal Grant No. W911NF-10-1-0231 awarded by the Army Research Office. The Government has certain rights in the invention.

FIELD OF THE INVENTION

The present invention relates to quantum computing systems in general, and, more particularly, to ultra-high-vacuum packaging for containing an ion trap in a quantum computing system.

BACKGROUND OF THE INVENTION

Quantum computing is an emerging technology that leverages a quantum mechanical phenomenon not available in classical systems (e.g., superposition and entanglement, etc.) to process information. In a conventional computing system, the basic unit of information is a bit, which is a two-state element that can be in either a "one" or "zero" state. In contrast, the basic unit of information in a quantum-computing system, referred to as a qubit, can be in any superposition of both states at the same time (referred to as "superposition states"). Furthermore, many qubits can be in a superposition of correlated states in a way that the system cannot be described as a product of the individual qubit states (referred to as "entangled states"). These forms of qubit states representing the information are not available in conventional (classical) computers. As a result, theoretically, a large-scale quantum computer can solve some problems that simply are not practically feasible using conventional computing approaches. Unfortunately, quantum computers have proven difficult to realize in large scale due.

One attractive avenue for realizing practical quantum computing is "trapped-ion processing," which relies on electromagnetic fields to confine atomic ions in free space and optical addressing and reading out of the qubits via one or more laser beams. Trapped-ion processing is seen as a potentially enabling technology for large-scale quantum computing and robust quantum information processing (QIP). New trapped-ion protocols that enable scalable quantum computing and long-distance quantum communication have been proposed and successfully demonstrated; however, the size and complexity of conventional ion traps has proven to be a limiting factor in the realization of a practical, large-scale, deployable trapped-ion QIP system.

Recently, progress in microfabricated (surface) traps have demonstrated high performance qubit measurement and quantum gates that outperform conventional manually assembled macroscopic traps. In fact, microfabricated surface traps capable of potentially supporting more than one hundred ions have been demonstrated, with single-qubit properties comparable to those demonstrated in macroscopic traps. As a result, it is believed that such traps represent a major step toward overcoming the scaling challenge faced by quantum computing.

Unfortunately, the use of chip-based ion traps leads to several other challenges, some intrinsic to the chip technology and others simply stemming from the scalable nature of this approach.

One significant challenge arises from the fact that ion traps are subject to anomalous heating, where the ion experiences higher-than-expected motional heating when they are trapped closer to the surface of the trapping electrodes. This will have substantial impact on the quality of multi-qubit gates mediated by the motional degree-of-freedom for the ions. Fortunately, recent studies suggest that in-situ cleaning of the trap electrodes can substantially decrease the heating rate to within an order of magnitude of the fundamental thermal noise limit.

Another challenge for chip-based ion traps is the need to isolate the trapped ions from the background residual gas molecules. As a result, ion traps must be operated at extremely high vacuum levels—typically $10^{-9}$ Torr or better. Historically, complex and cumbersome infrastructure has been necessary to achieve such vacuum levels. As a result, the scalability of conventional quantum computing systems that employ microfabricated surface traps remains a challenge.

In addition, a microfabricated surface trap requires a source of ions for loading the trap. Typically, the ions are captured from an atomic plume generated by a source, such as a thermal oven. Unfortunately, the heat generated by conventional sources can interfere with ion-trap operations. By scaling the ion trap system smaller, the distance between the source and ion trap shrinks, further exacerbating thermal coupling between them.

The need for a practical ion-trap enclosure that can support high-vacuum conditions, generation of high-voltage radio-frequency (RF) signals, large numbers of DC signals, enable optical access for one or more laser beams for addressing/reading out trap states, and operation of a source of atomic flux remains, as yet, unmet in the prior art.

SUMMARY OF THE INVENTION

The present invention enables practical, large-scale quantum computers without some of the costs and disadvantages of the prior art. Embodiments of the present invention employ integrated packaging techniques to significantly reduce the size and complexity of ion-trap enclosures necessary to the operation of a quantum computer while improving their operation by reducing thermal cross-talk between the ion trap and the source used to load the trap.

Like enclosures of the prior art, the present invention contains an ion trap in a high-vacuum chamber formed by joining a housing joined with a surface of a chip carrier. In the prior art, the high-vacuum chamber also contains a source for providing the atomic flux used to load the trap. As a result, heat generated by the source readily couples with the ion trap, which can interfere with trap operations.

In marked contrast to the prior art, embodiments of the present invention separate the ion trap and the source into different high-vacuum chambers that are located on opposite sides of the chip carrier. The atomic flux generated by the source propagates through a conduit between the two chambers to enable the loading of the trap with ions; however, the separation of the source and ion trap into separate chambers on opposite sides of the chip carrier reduces thermal coupling between them. Embodiments of the present invention, therefore, are better able to operate at cryogenic temperatures than the prior art.

An illustrative embodiment of the present invention is an ion-trap enclosure comprising a first chamber located on a first side of a chip carrier and a second chamber located on the opposite side of the chip carrier, where the first chamber contains an ion trap and the second chamber contains a source for providing an atomic flux. Through-ports formed in the chip carrier, ion trap, and an optional interposer are aligned to collectively define a conduit between the two chambers that enables the ion trap to receive atomic flux from the source. A cryosorption pump is included in the enclosure to facilitate realization of a high-vacuum condition within both chambers.

In some embodiments, the first chamber is configured to position a non-evaporable getter in close proximity to the ion trap to improve trap lifetime.

In some embodiments, the source is a thermal oven that generates the atomic flux via sublimation of source material.

In some embodiments, the source is an ablation oven comprising an ablation laser and a crucible for holding source material. The ablation laser and crucible are arranged such that the output of the laser can ablate the source material to generate the atomic flux.

In some embodiments, the cryosorption pump is replaced by an ion pump.

An embodiment of the present invention is an ion-trap enclosure comprising: a chip carrier having a first major surface and a second major surface that is distal to the first major surface; an ion trap, wherein the ion trap is disposed on a substrate that is disposed on the first major surface; a source that is operative for providing an atomic flux to the ion trap, the atomic flux comprising atoms of a first material; a first housing, the first housing and the first surface being joined at a first seal such that the first housing and the first major surface collectively define a first chamber that contains the ion trap; and a second housing, the second housing and the second major surface being joined at a second seal such that the second housing and the second major surface collectively define a second chamber that contains the source; wherein the first chamber and second chamber are fluidically coupled.

Another embodiment of the present invention is an ion-trap enclosure comprising: a first chamber that contains an ion trap, wherein the ion trap is disposed on a first surface of a substrate, and wherein the first chamber includes a first housing that enables optical coupling between the ion trap and a first light signal; a second chamber that contains a source that is operative for providing an atomic flux that includes atoms of a first material; wherein the first chamber and second chamber are fluidically coupled such that the atomic flux is received at the ion trap; wherein heat flow between the first chamber and second chamber is restricted; wherein the substrate is located between the ion trap and the source; and wherein the ion-trap enclosure enables a pressure level within the first chamber that is less than or equal to $10^{-9}$ Torr.

Yet another embodiment of the present invention is a method comprising forming an ion-trap enclosure by operations including: providing the ion trap such that it is disposed on a substrate that is disposed on a chip carrier having a first major surface and a second major surface that is distal to the first major surface; joining a first housing and the second major surface to define a first chamber that contains a source that is operative for providing an atomic flux that includes atoms of a first material; and joining a second housing and the first major surface to define a second chamber that is fluidically coupled with the first chamber such that the ion trap can receive at least a portion of the atomic flux from the source; wherein the first housing, second housing, and chip carrier are joined such that the ion-trap enclosure enables a pressure level within the first chamber that is less than or equal to $10^{-19}$ Torr.

BRIEF DESCRIPTION OF THE DRAWINGS

FIGS. 4A-D depict salient features of enclosure 200 at different points in its fabrication.

DETAILED DESCRIPTION

Figure 1A:
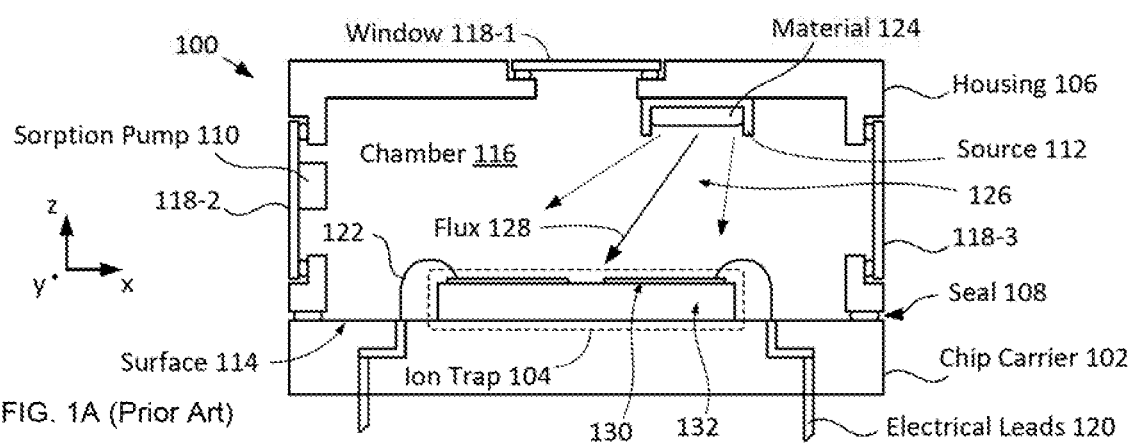
FIG. 1A depicts a schematic drawing of a cross-sectional view of an ion-trap enclosure in accordance with the prior art.

FIG. 1A depicts a schematic drawing of a cross-sectional view of an ion-trap enclosure in accordance with the prior art. Enclosure 100 includes chip carrier 102, ion trap 104, housing 106, seal 108, cryosorption pump 110, and source 112, all of which are contained within a single chamber. Enclosure 100 is analogous to ion-trap enclosures known in the prior art, such as those described by Brown, et al., in "Co-Designing a Scalable Quantum Computer with Trapped Atomic Ions," arXiv:1602.02840v1 [quant-ph]," (2016), which is incorporated herein by reference.

Ion-trap 104 is die-attached onto surface 114 of chip carrier 102, which is a conventional ceramic chip package—for example, a ceramic pin grid array (CPGA).

Ion trap 104 is a conventional microfabricated surface trap that includes a plurality of high-voltage and/or RF electrodes 130, which are formed in a precise arrangement on the top surface of substrate 132 (e.g., a silicon wafer, glass substrate, etc.). Ion trap 104 is configured such that high-power laser beams can access the regions near the electrode surfaces to effect Coulomb gates and/or photonic couplings without incurring significant light scattering. Examples of microfabricated ion traps are disclosed by Stick, et al., in "Ion Trap in a Semiconductor Chip," *Nature Physics*, Vol. 2, pp. 36-39 (2006), which is incorporated herein by reference.

Once ion trap 104 is die attached on the chip carrier, electrodes 130 are electrically connected to electrical leads 120 of chip carrier 102 via wire bonds 122. In some cases, chip carrier 102 includes solder bumps suitable for conventional solder-bump bonding are disposed on its bottom surface, rather than electrical leads 120.

Figure 1B:
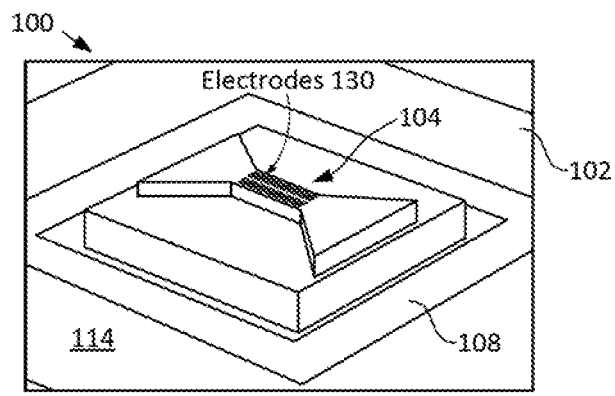
FIG. 1B shows a photograph of a perspective view of a nascent ion trap enclosure in accordance with the prior art.

FIG. 1B shows a photograph of a perspective view of a nascent ion trap enclosure in accordance with the prior art. FIG. 1B depicts enclosure 100 after ion trap 104 has been mounted on an optional interposer located on chip carrier 102.

To form chamber 116, housing 106 is joined to surface 114 of chip carrier 102 via seal 108. The housing is typically a mechanically rigid structure comprising a central cavity, where the structure is configured to withstand vacuum levels of at least $10^{-10}$ Torr in its interior. Housing 106 includes windows 118-1 through 118-3, which enable optical access for one or more light signals required for operation of the ion trap. The windows are affixed over through-ports in housing 106 using a sealing technology suitable for making a vacuum-tight seal.

Seal 108 is typically a ring of indium that surrounds the ion-trap chip. With the housing in place on the chip carrier, and typically while located in a high-vacuum environment to establish an initial vacuum state within chamber 116, the indium is melted to form a vacuum-tight seal between them to support the maintenance of a vacuum environment within chamber 116.

Figure 1C:
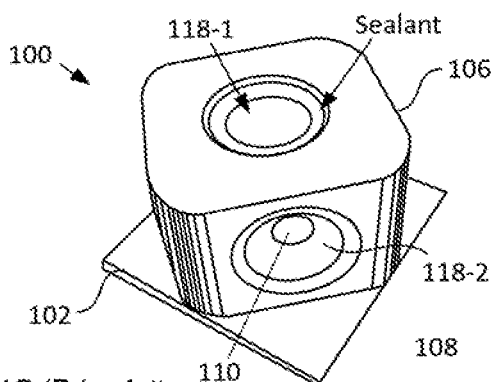
FIG. 1C shows a photograph of a perspective view of an ion trap enclosure in accordance with the prior art.

FIG. 1C shows a photograph of a perspective view of an ion trap enclosure in accordance with the prior art.

Prior to housing 106 being attached to the chip carrier, cryosorption pump 110 and source 112 are mounted within the housing so that they are properly positioned within sealed chamber 116 when enclosure 100 is complete.

Source 112 is a thermal oven operative for sublimating material 124 to generate atomic plume 126, which includes atomic flux 128. In operation, source 112 loads ion trap 104 by heating material 124 to generate atomic plume 126, a portion of which is atomic flux 128, which propagates in line-of-sight fashion toward ion trap 104. Typically, material 124 includes ytterbium; however, other materials, such as beryllium, magnesium, strontium, calcium, and the like, are also used in some prior-art applications.

Cryosorption pump 110 is typically a charcoal sorption pump that is operative for removing inert molecules such as helium from the environment within the enclosure during cryogenic operation.

While enclosure 100 is an example of a small-volume, high-vacuum environment for an ion trap, the co-location of ion trap 104 and source 112 within a single chamber is disadvantageous in practice. Specifically, when sublimating material 124, source 112 generates significant heat (up to several hundred degrees Celsius), which can interfere with ion-trapping operations. This is particularly deleterious for enclosures for which cryogenic operation is desired, such as the depicted example in which a cryosorption pump is utilized to reduce helium content in chamber 116.

It is an aspect of the present invention, however, that improved ion-trap operation can be realized by locating source 112 and ion trap 104 in separate chambers—preferably, located on opposite sides of a chip carrier. Such an arrangement provides a level of thermal isolation between the source and ion trap that mitigates the effects of heat generated during operation of source 112.

Figure 2:
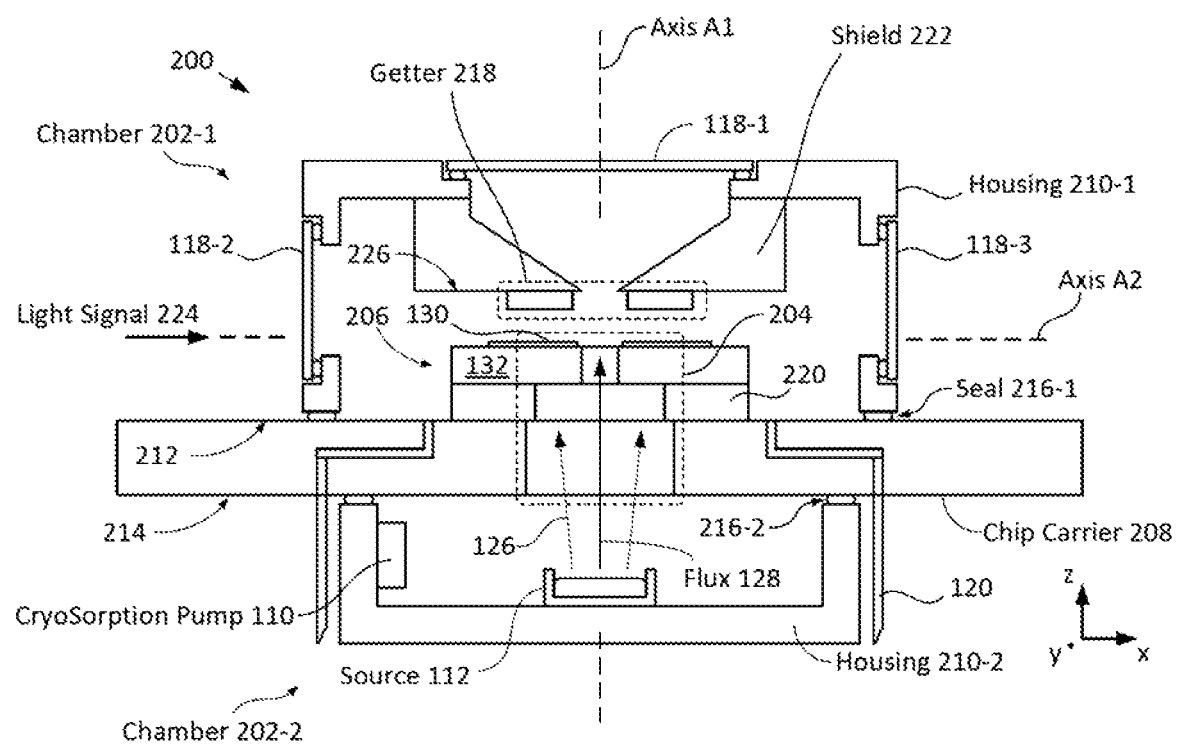
FIG. 2 depicts a schematic drawing of a cross-sectional view of an ion-trap enclosure in accordance with an illustrative embodiment of the present invention.

FIG. 2 depicts a schematic drawing of a cross-sectional view of an ion-trap enclosure in accordance with an illustrative embodiment of the present invention. Enclosure 200 includes chambers 202-1 and 202-2, conduit 204, ion trap 206, chip carrier 208, getter 218, and cryosorption pump 110.

Chambers 202-1 and 202-2 are separate chambers located on opposite sides of chip carrier 208.

Chamber 202-1 is analogous to chamber 116. Chamber 202-1 contains ion trap 206 and getter 218, but excludes source 112. Chamber 202-1 is defined by chip carrier 208 and housing 210-1, which is joined to surface 212 of the chip carrier at seal 216-1.

Chamber 202-2 is also analogous to chamber 116. Chamber 202-2 contains source 112 and cryosorption pump 110, but excludes ion trap 206. Chamber 202-2 is defined by chip carrier 208 and housing 210-2, which is joined to surface 214 of chip carrier 208 at seal 216-2.

Chambers 202-1 and 202-2 are located on opposite sides of chip carrier 208 to mitigate thermal coupling between the source and ion trap. To enable atomic flux 128 to flow from source 112 to ion trap 206, chambers 202-1 and 202-2 are fluidically coupled via conduit 204. As discussed below, conduit 204 includes through-ports formed in each of chip carrier 208, interposer 220, and substrate 132 of ion trap 206.

Figure 3:
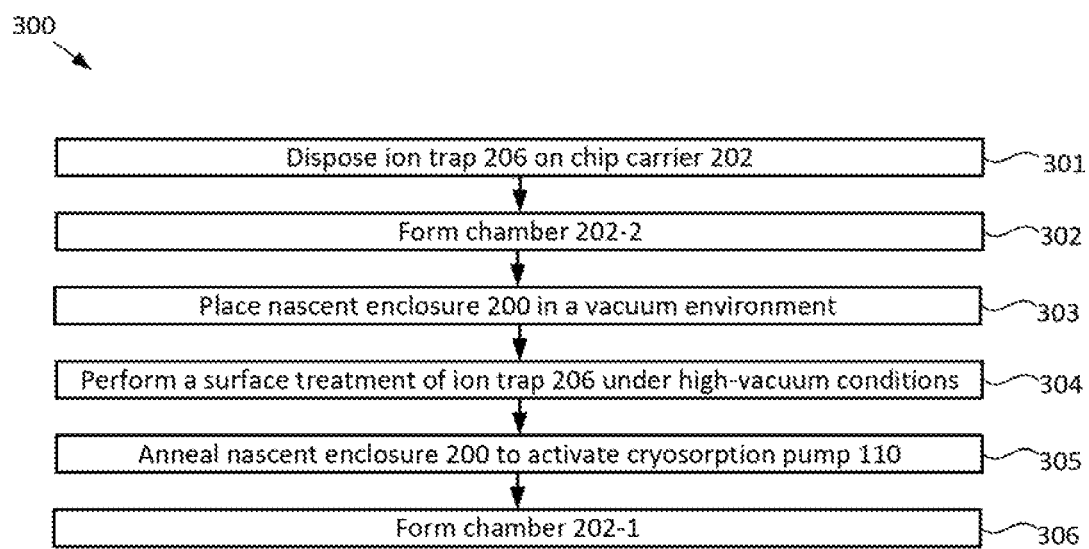
FIG. 3 depicts operations of a method suitable for forming enclosure 200 in accordance with the illustrative embodiment of the present invention.

FIG. 3 depicts operations of a method suitable for forming enclosure 200 in accordance with the illustrative embodiment of the present invention. Method 300 begins with operation 301, wherein ion trap 206 is located on chip carrier 208. Method 300 is described with continuing reference to FIGS. 2A-B, as well as reference to FIGS. 4A-C.

FIGS. 4A-D depict views of salient features of enclosure 200 at different points in its fabrication.

Figure 4A:
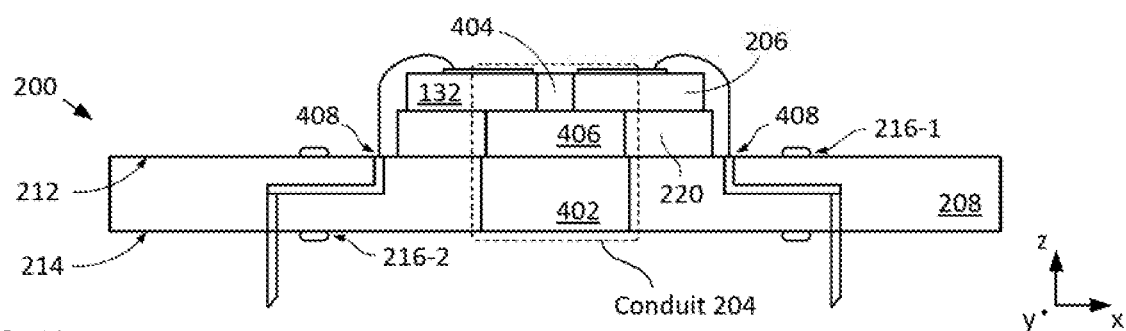

FIG. 4A depicts a schematic drawing of a cross-sectional view of nascent enclosure 200 showing ion trap 206 disposed on carrier 208.

Chip carrier 208 is analogous to chip carrier 102 described above; however, chip carrier 208 includes port 402 and seals 216-1 and 216-2.

Seals 216-1 and 216-2 are metal traces formed on surfaces 212 and 214, respectively. In the depicted example, seals 216-1 and 216-2 are annular traces that include layers of gold and tin suitable for forming a gold-tin eutectic bond to join the chip carrier with each of housings 210-1 and 210-2. In some alternative embodiments, at least one of the seals includes a different material suitable for joining the chip carrier and a housing.

Port 402 is an aperture that extends through the thickness of chip carrier 208 within a die-attach area configured for receiving ion trap 206.

Ion trap 206 is disposed on the chip carrier such that substrate 132 resides on optional interposer 220, which resides on surface 212 of chip carrier 208. For the purposes of this Specification, including the appended claims, the term "disposed on" is defined as "exists on" an underlying layer or structure. Intermediate layers or structures, such as transitional layers, interposers, etc., might exist in the intervening space between the element and the structure on which it is disposed, as necessary to ensure a suitable surface/arrangement. For example, if an element is described to be "disposed on a substrate," this can mean that either (1) the material of the element is in intimate contact with the substrate; or (2) the material of the element is in contact with one or more transitional layers/structures that reside on the substrate.

Figure 4B:
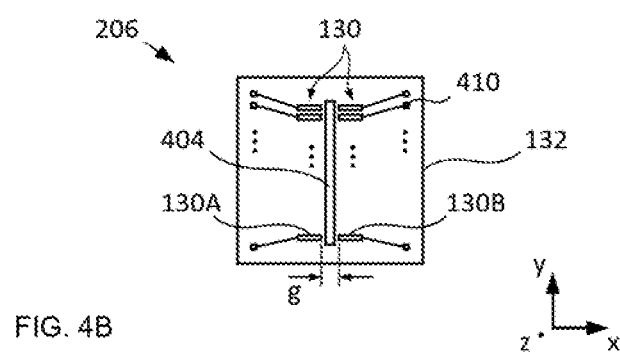

FIG. 4B depicts a schematic drawing of a top view of ion trap 206. Ion trap 206 includes substrate 132, electrodes 130, port 404, and wirebond pads 410.

Electrodes 130 include electrode arrays 130A and 130B, whose end faces oppose one another across gap g.

Port 404 is a through-hole that extends through the thickness of substrate 132 within the region of gap g. As discussed below, port 404 forms part of conduit 204 once ion trap 206 is disposed on chip carrier 208.

Wirebond pads 410 are conventional wirebond pads that are arranged along the outer edges of substrate 132. Wirebond pads 410 are electrically connected to electrodes 130.

Interposer 220 is a conventional integrated-circuit interposer that includes port 406, which extends through its thickness. Interposer 220 is included to set the height of the ion trap above the chip carrier such that electrodes 130 are proximate to axis A1, which extends between windows 118-2 and 118-3.

Ion trap 206, interposer 220, and chip carrier 208 are arranged such that at least portions of ports 402, 404, and 406 overlap to collectively define conduit 204. As a result, both chambers can be pumped with the same pumping system and the output of source 112 can propagate through the ion trap/interposer/chip-carrier assembly.

Once ion trap 206 is disposed on chip carrier 208, wire bonds are made between wirebond pads 410 (as well as wirebond pads connect with any additional electronics included within enclosure 200) and wirebond pads 408, which are electrically connected to electrical leads 120.

In some embodiments, ion trap 206 resides directly on surface 212 of the chip carrier without the inclusion of an interposer.

At operation 302, chamber 202-2 is formed by joining housing 210-2 to surface 214 of chip carrier 208 via seal 216-2.

Figure 4C:
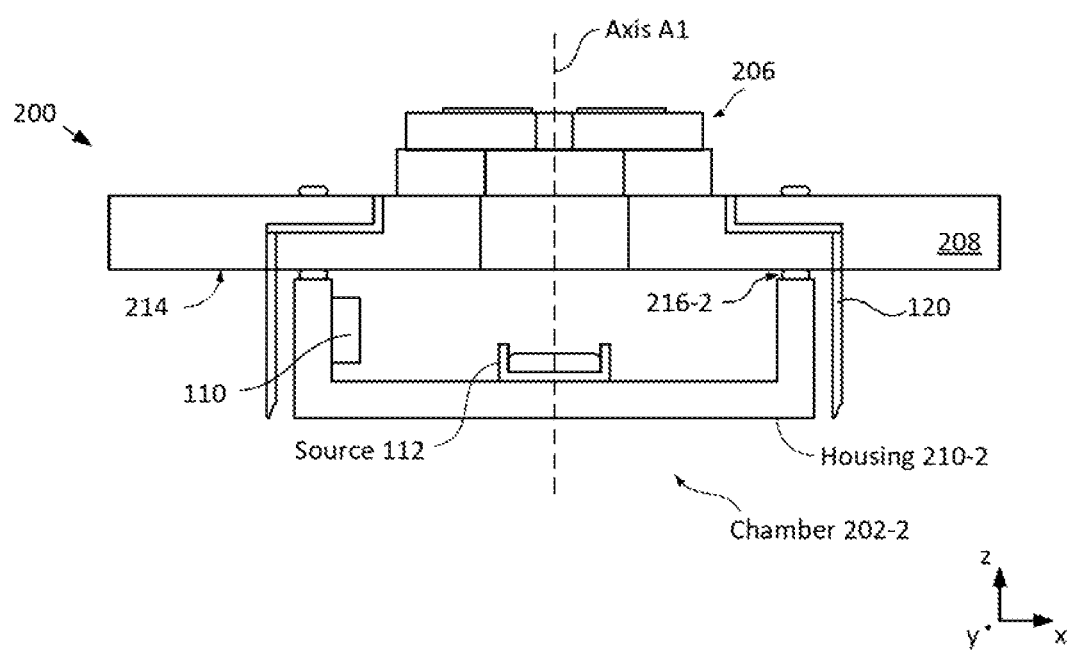

FIG. 4C depicts a schematic drawing of a cross-sectional view of enclosure 200 after housing 210-2 and chip carrier 208 are joined to form chamber 202-2.

Housing 210-2 is a mechanically rigid structure comprising a central cavity. Housing 210-2 is configured to withstand vacuum levels of $10^{-9}$ Torr or lower in its interior. In the depicted example, housing 210-2 comprises titanium; however, any material having sufficient strength and dimensional stability can be used in housing 210-2.

Source 112 is located on the interior bottom surface of housing 210-2 such that it is aligned along axis A1, which is centered with ion trap 206. Preferably, source 112 is located such that it is concentric with ion trap 206 along axis A1; however, other arrangements of source and ion trap can be used without departing from the scope of the present invention.

The arrangement of the source 112 and ion trap 206 results in atomic flux 128 being directed at the ion trap from its back (i.e., substrate) side through conduit 204.

It should be noted that housing 210-2 is configured such that it resides within an open region between electrical leads 120, which provide all electrical connectivity to elements of enclosure 200. Such a configuration simplifies obtaining and maintaining a high vacuum level within the enclosure by avoiding electrical feed-throughs that can give rise to leaks. In addition, bringing the electrical signals into and out of the enclosure through the chip carrier avoids the need for additional wiring inside the enclosure and enables the use of conventional printed-circuit boards and integrated circuits for the high-density electronics (not shown) necessary for operating the ion trap.

At operation 303, nascent enclosure 200 is placed into an ultra-high vacuum (UHV) processing system that enables additional processing operations to be conducted while the nascent enclosure is under vacuum.

Figure 5:
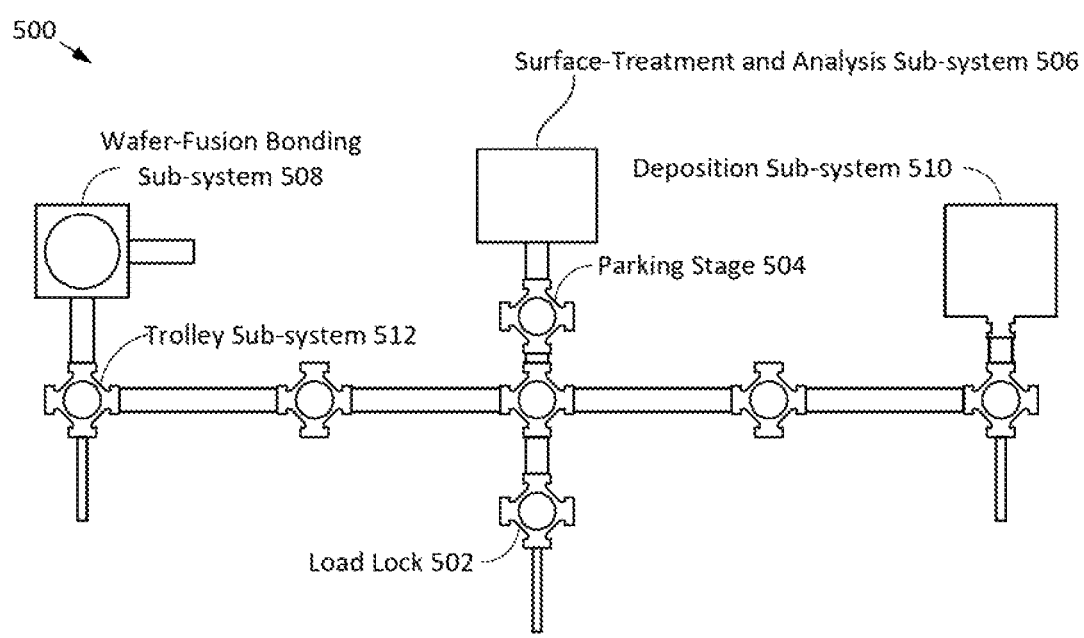
FIG. 5 depicts a schematic drawing of an exemplary UHV processing system suitable for use with method 300.

FIG. 5 depicts a schematic drawing of an exemplary UHV processing system suitable for use with method 300.

Process system 500 includes conventional load lock 502, sample parking stage 504, surface-treatment and analysis sub-system 506, packaging subsystem 508, deposition sub-system 510, and trolley sub-system 512.

Surface-treatment and analysis sub-system 506 is a sub-system for modifying one or more surfaces of a housing and/or an ion trap/chip carrier assembly at a base pressure of $10^{-9}$ Torr or lower, as well as characterization of the modified surface or surfaces, prior to fully sealing the completed enclosure. In the depicted example, surface-treatment and analysis sub-system 506 includes an argon-ion sputter gun and an X-ray photoelectron spectroscopy (XPS) tool. In some embodiments, a different surface treatment tool and/or surface-analysis tool (e.g., Auger spectroscopy, Kelvin probe tools, etc.) is included in surface-treatment and analysis sub-system 506.

Packaging sub-system 508 is a sub-system for forming vacuum-tight seals between the chambers of enclosure 200 at a base pressure of approximately $10^{-9}$ Torr or lower. In the depicted example, packaging sub-system 508 includes a graphite heater configured to treat a housing and/or an ion trap/chip carrier assembly at a temperature suitable for forming seals 216-1 and 216-2, which, in some embodiments, can require temperatures as high as 1200° C. It is also operative for aligning and stacking the housing and chip carrier together in a self-alignment process enabled by mechanical guiding structures. Packaging sub-system 508 also enables annealing of trap surfaces and the in-situ sealing of one or more windows optionally included in the housing.

Deposition sub-system 510 is a conventional sputtering system configured to sputter one or more surfaces of enclosure 200 while it is held at a base pressure of $10^{-9}$ Torr or lower. In some embodiments, deposition sub-system 510 includes a different material-deposition system, such as an evaporation system (e.g., thermal evaporation system, electron-beam evaporation system, etc.), a chemical deposition system (e.g., plasma-enhanced chemical vapor deposition (PECVD), low-pressure chemical vapor deposition (LPCVD), etc.), an atomic-layer deposition (ALD) system, and the like.

Trolley sub-system 512 enables transport of a nascent enclosure through the entire process system while it is held at a base pressure of $10^{-9}$ Torr or lower.

At operation 304, the surface of ion trap 206 is treated to mitigate anomalous heating experienced by ions in the trap during its operation. Treatment of the surface of the ion trap includes sputtering via the argon-ion sputter system in the surface-treatment and analysis sub-system 506 while nascent enclosure 200 is held in high vacuum. In some embodiments, the ion-trap surface is treated with a different treatment suitable for achieving a desired surface condition.

At operation 305, nascent enclosure is heated to activate cryosorption pump 110.

At operation 306, chamber 202-1 is formed by joining housing 210-1 to surface 212 of chip carrier 208 via seal 216-1. By forming chamber 202-1 while the nascent enclosure is held in high vacuum within system 500, chamber 202-1 is provided an initial vacuum state equal to that of system 500—typically, approximately $10^{-9}$ Torr or lower.

FIG. 4D depicts a schematic drawing of a cross-sectional view of enclosure 200 after housing 210-1 and chip carrier 208 are joined to form chamber 202-1.

Housing 210-1 is analogous to housing 106; however, housing 210-1 also comprises shield 222. Like housing 106, housing 210-1 includes windows 118-1 through 118-3, which provide optical access to the ion trap for light signals used to optically control the qubits during operation of ion trap 206. In some embodiments, housing 210-1 is joined to chip carrier 208 prior to the placement and sealing of one or more of its windows. In such cases, the windows are also installed and sealed while nascent enclosure 200 resides under high vacuum within system 500.

As discussed above, the height of ion trap 206 above chip carrier 208 is established (via interposer 220) to place the ion trap adjacent to axis A2, which runs from windows 118-2 and 118-3 parallel to the surface of ion trap 206. As a result, when light signal 224 is provided along axis A2 to photo-ionize atoms in atomic flux 128, its propagation direction is orthogonal to the flow of these atoms along axis A1, which mitigates Doppler shift/broadening associated with the velocity of the atomic flux.

Getter 218 is a non-evaporable getter (NEG), which is disposed on surface 226 of shield 222. Shield 222 is configured to position getter 218 near the surface of ion trap 206 after housing 210-1 is joined with chip carrier 208. By providing getter 218 such that it lies near the surface of ion trap 206, trap lifetime is improved.

In some embodiments, getter 218 is disposed on a separate support that is joined to chip carrier 208 prior to the addition of housing 210-1. Such embodiments afford an advantage in that the separation of the getter pump can be controlled independently from the configuration of housing 210-1 and the placement of its windows.

It should be noted that either or both of cryosorption pump 110 and getter 218 can be located in chamber 202-1 without departing from the scope of the present invention.

Furthermore, the operations of method 300 can be performed in any order—for example, chamber 202-1 can be formed before chamber 202-2, etc.

Although locating ion trap 206 and source 112 in different chambers reduces the deleterious effects of heat generated during sublimation of material 124, in some embodiments (e.g., when cryogenic operation is necessary), additional thermal stability is required. As a result, in some embodiments of the present invention, atomic plume 126 is provided by laser ablation of material 124 rather than by its thermal sublimation.

Figure 6:
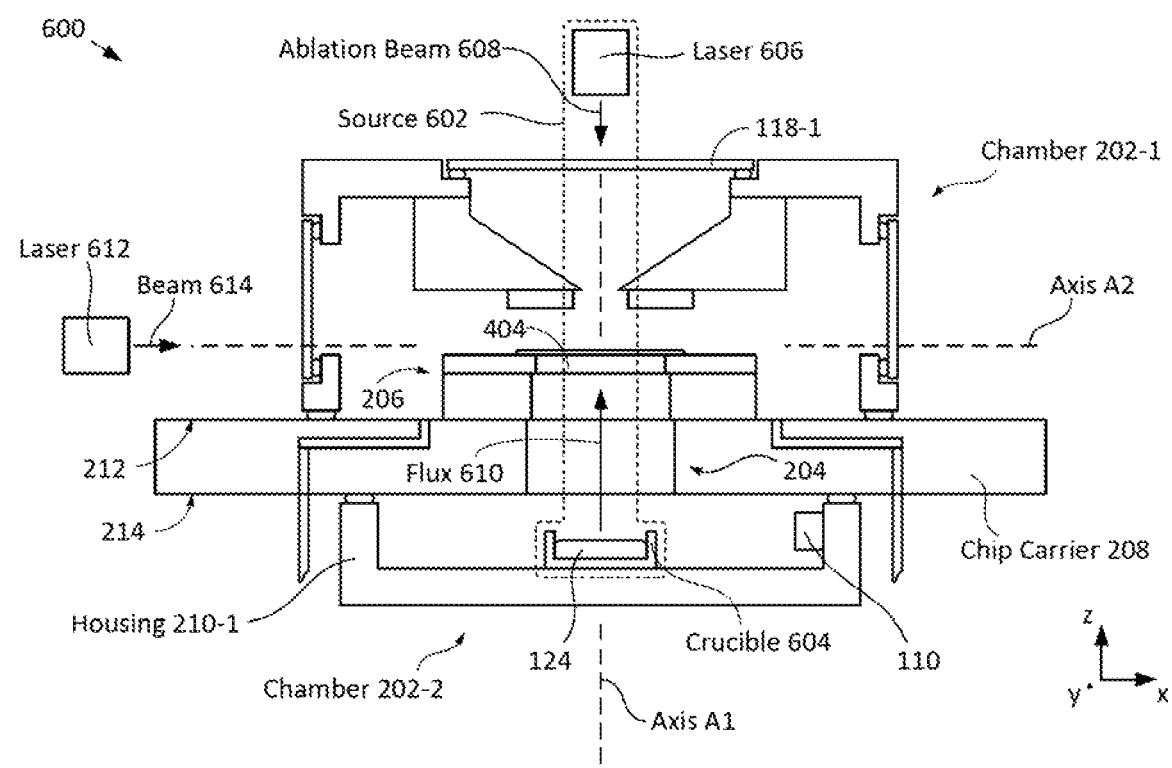
FIG. 6 depicts a schematic drawing of a portion of a multi-chamber enclosure for facilitating operation at cryogenic temperatures in accordance with a first alternative embodiment of the present invention.

FIG. 6 depicts a schematic drawing of a portion of a multi-chamber enclosure for facilitating operation at cryogenic temperatures in accordance with a first alternative embodiment of the present invention. Enclosure 600 is analogous to enclosure 200; however, enclosure 600 includes an ablation oven for producing an atomic flux. As a result, significantly less heat is generated during the production of the atomic plume.

Source 602 is an ablation oven comprising crucible 604 and laser 606. Source 602 generates an atomic plume that includes atomic flux 610 by irradiating material 124 with ablation beam 608, which is directed into enclosure 600 through window 118-1 such that the beam propagates along axis A1. As a result, ablation beam 608 passes through conduit 206 en route to material 124.

Crucible 604 is a conventional crucible for holding material 124. In some embodiments, crucible 604 is incorporated into housing 210-1.

Source 602 is configured to create atomic flux 610 such that it predominantly includes neutral atoms. In order to load ion trap 206, therefore, these neutral atoms must be ionized. In the depicted example, enclosure 600 includes laser 612, which is a resonant source that provides laser beam 614 along axis A2 to photo-ionize neutral atoms in atomic flux 610 to create ions suitable for trapping. As discussed above, preferably, axes A1 and A2 are orthogonal to mitigate Doppler shift/broadening associated with the velocity of the atomic flux.

One skilled in the art will recognize, after reading this Specification, that the width of gap g is typically quite narrow. As a result, the width of port 404 in ion trap 206 is also very narrow. As a result, it is possible that ablation/damage to the ion trap can occur when ablation beam 608 passes through port 404. In some embodiments, therefore, the ablation beam is routed such that it does not pass through the ion trap to mitigate the risk of damage to the ion trap.

Figure 7:
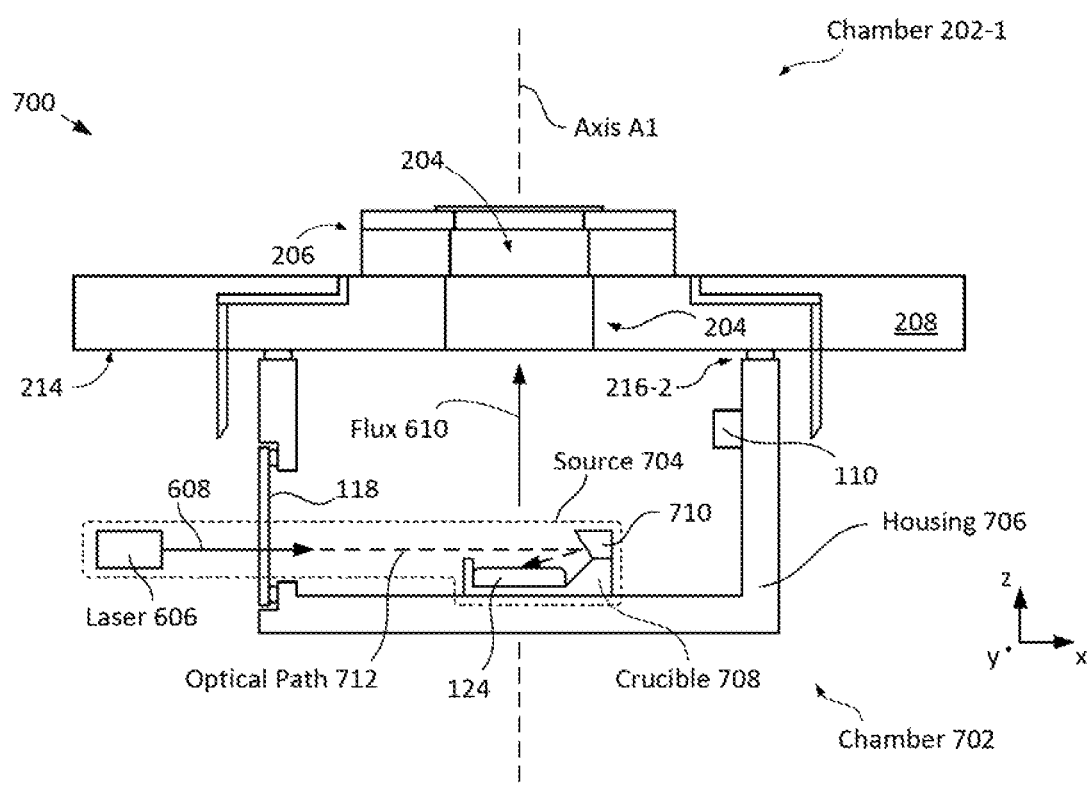
FIG. 7 depicts a schematic drawing of a cross-section of the salient features of an enclosure in accordance with a second alternative embodiment of the present invention.

FIG. 7 depicts a schematic drawing of a cross-section of the salient features of an enclosure in accordance with a second alternative embodiment of the present invention. Enclosure 700 is analogous to enclosure 600; however, enclosure 700 includes an ablation oven having an ablation beam that is directed to material 124 without passing through ion trap 206. Enclosure 700 includes chambers 202-1 and 702, conduit 204, ion trap 206, chip carrier 208, getter 218 (not shown), cryosorption pump 110, and source 704.

Chamber 702 is defined by housing 706 and surface 214 of chip carrier 208, which are joined at seal 216-2, as described above.

Source 704 includes laser 606, crucible 708, and turning mirror 710. As in enclosure 600, laser 606 is located outside housing 706.

Housing 706 is analogous to housing 106 described above and with respect to FIG. 1. Housing 706 includes window 118, which is configured to enable optical access to material 124 for laser 606.

Crucible 708 is analogous to crucible 604; however, crucible 708 is configured to mount turning mirror 710, as well as accommodate the optical path of ablation beam 608 as it is received from the turning mirror. In response to the receipt of ablation beam 608, crucible 708 gives rise to an atomic plume that includes atomic flux 610, which is directed along axis A1, as described above.

Turning mirror 710 is a conventional first-surface reflector that is arranged to reflect ablation beam 608 from laser 606 toward material 124.

Source 704 and housing 706 are configured to enable optical path 712 from laser 606 to material 124 without passing ablation beam 608 through ion trap 206.

In some embodiments, cryogenic operation is not critical. In such embodiments, cryosorption pump 110 can be replaced with a miniature ion pump.

Figure 8:
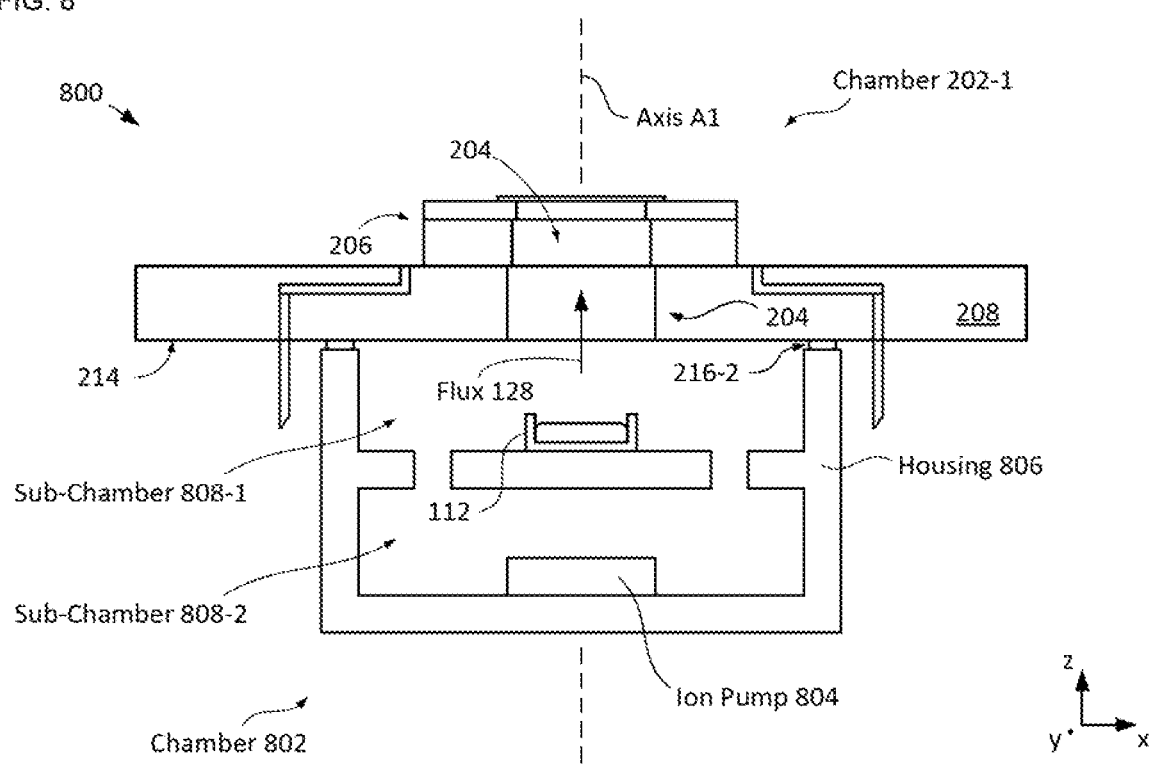
FIG. 8 depicts a schematic drawing of a sectional view of the salient features of an enclosure in accordance with a third alternative embodiment of the present invention.

FIG. 8 depicts a schematic drawing of a sectional view of the salient features of an enclosure in accordance with a third alternative embodiment of the present invention. Enclosure 800 is analogous to enclosure 200; however, in enclosure 800 the cryosorption pump is replaced with an ion pump.

Enclosure 800 includes chambers 202-1 and 802, conduit 204, ion trap 206, chip carrier 208, getter 218 (not shown), source 112, and ion pump 804.

Chamber 802 is analogous to chamber 202-2; however, chamber 802 includes sub-chamber 808-1 and 808-2, which are fluidically coupled. Source 112 is contained within sub-chamber 808-1, while ion pump 804 is contained in sub-chamber 808-2. Chamber 802 is defined by housing 806 and surface 214, which are joined at seal 216-2, as described above.

It should be noted that, although enclosure 800 includes a source comprising a thermal oven, other ovens (e.g., an ablation oven) can be used in source 112 without departing from the scope of the present invention.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. An ion-trap enclosure comprising:
   a chip carrier having a first surface and a second surface that is distal to the first surface;
   an ion trap, wherein the ion trap is disposed on a substrate that is disposed on the first surface;
   a source that is dimensioned and arranged to provide an atomic flux that predominantly includes neutral atoms of a first material to the ion trap along a first axis;
   a first housing, the first housing and the first surface being joined at a first seal such that the first housing and the first surface collectively define a first chamber that contains the ion trap, wherein the first housing includes a first window that enables optical coupling between the ion trap and a first light signal that is directed along a second axis that is substantially orthogonal to the first axis, the first light signal being operative for photo-ionizing at least one neutral atom of the plurality thereof at the ion trap; and
   a second housing, the second housing and the second surface being joined at a second seal such that the second housing and the second surface collectively define a second chamber that contains the source;
   wherein the first chamber and second chamber are fluidically coupled.

2. The ion-trap enclosure of claim 1 wherein the source includes an oven selected from the group consisting of (i) an ablation oven that generates the atomic flux via laser ablation of the first material and (ii) a thermal oven that provides the atomic flux via sublimation of the first material.

3. The ion-trap enclosure of claim 1 wherein the first light signal is directed along a first direction and the atomic flux propagates along a second direction that is substantially orthogonal with the first direction.

4. The ion-trap enclosure of claim 2 wherein the second housing is configured to enable optical coupling between the first material and a first light signal that is operative for ablating the first material, and wherein the second housing, the source, and the ion trap are arranged such that the first light signal has an optical path that does not pass through the ion trap.

5. The ion-trap enclosure of claim 1 wherein the enclosure enables a pressure level within the first chamber that is less than or equal to $10^{-9}$ Torr.

6. The ion-trap enclosure of claim 1 wherein the chip carrier includes at least one port that enables passage of the atomic flux from the second chamber to the first chamber.

7. The ion-trap enclosure of claim 1 further comprising an ion pump that is fluidically coupled with the first chamber, wherein the second chamber includes a first sub-chamber and a second sub-chamber, and wherein the ion pump is contained in one of the first and second sub-chambers.

8. The ion-trap enclosure of claim 1 further comprising a getter pump that is fluidically coupled with the first chamber.

9. The ion-trap enclosure of claim 1 further comprising a cryosorption pump that is fluidically coupled with the first chamber.

10. An ion-trap enclosure comprising:
    a chip carrier having a first major surface and a second major surface that is distal to the first major surface, the chip carrier including a first seal, a second seal, and a first port that extends through the chip carrier;
    a substrate comprising an ion trap and a second port that extends through the substrate, wherein the substrate is mounted on the first major surface such that the ion trap is distal to the first major surface; a source that is dimensioned and arranged to provide an atomic flux that predominantly includes neutral atoms of a first material to the ion trap:
    a first chamber that contains the ion trap and excludes the source, the first chamber comprising a first housing that is joined with the first major surface at the first seal, wherein the first housing is configured to enable optical coupling between the ion trap and a first light signal that is operative for photo-ionizing at least one neutral atom of the plurality thereof at the ion trap;
    a second chamber that contains the source and excludes the ion trap, the second chamber comprising a second housing that is joined with the second major surface at the second seal; and
    a conduit that fluidically couples the first chamber and second chamber, wherein the conduit includes the first and second ports;
    wherein the ion-trap enclosure enables a pressure level within the first chamber that is less than or equal to 10–9 Torr.

11. The ion-trap enclosure of claim 10 wherein the source includes an oven selected from the group consisting of (i) an ablation oven that generates the atomic flux via laser ablation of the first material and (ii) a thermal oven that provides the atomic flux via sublimation of the first material.

12. The ion-trap enclosure of claim 11, wherein the second housing is configured to enable optical coupling between the first material and a second light signal that is operative for ablating the first material, and wherein the second housing, the source, and the ion trap are arranged such that the second light signal has an optical path that does not pass through the ion trap.

13. The ion-trap enclosure of claim 10 further comprising an interposer that is located between the substrate and the chip carrier.

14. A method for forming an ion-trap enclosure, the method comprising:
    providing a substrate such that it is disposed on a first major surface of a chip carrier that includes a first port that extends through the chip carrier, wherein the substrate comprises an ion trap and a second port that extends through the substrate, and wherein the substrate and chip carrier are arranged such that the first and second ports are fluidically coupled;
    providing a source that is configured to provide an atomic flux that predominantly includes neutral atoms of a first material to the ion trap;
    joining a first housing and the first major surface at a first seal to define a first chamber that includes the ion trap and excludes the source, wherein the first chamber is fluidically coupled with a conduit that includes the first and second ports, and wherein the first housing is configured to enable optical coupling between the ion trap and a first light signal that is operative for photo-ionizing at least one neutral atom of the plurality thereof at the ion trap; and joining a second housing and a second major surface of the chip carrier at a second seal to define a second chamber that includes the source and excludes the ion trap, wherein the second chamber is fluidically coupled with the conduit.

15. The method of claim 14 wherein the first and second chambers are defined such that a pressure level within the first chamber is less than or equal to $10^{-9}$ Torr.

16. The method of claim 14 wherein the source is provided such that it includes an oven that is selected from the group consisting of (i) an ablation oven that generates the atomic flux via laser ablation of the first material and (ii) a thermal oven that provides the atomic flux via sublimation of the first material.

17. The method of claim 16 further comprising providing the second housing such that it enables optical coupling between the first material and a second light signal that is operative for ablating the first material, wherein the second housing, the source, and the ion trap are arranged such that the second light signal has an optical path that does not pass through the ion trap.

\* \* \* \* \*